US011362093B2

(12) United States Patent
Bi et al.

(10) Patent No.: US 11,362,093 B2
(45) Date of Patent: Jun. 14, 2022

(54) CO-INTEGRATION OF NON-VOLATILE MEMORY ON GATE-ALL-AROUND FIELD EFFECT TRANSISTOR

(71) Applicant: International Business Machines Corporation, Armonk, NY (US)

(72) Inventors: Zhenxing Bi, Dunn Loring, VA (US); Zheng Xu, Wappingers Falls, NY (US); Dexin Kong, Slingerlands, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 146 days.

(21) Appl. No.: 17/037,972

(22) Filed: Sep. 30, 2020

(65) Prior Publication Data

US 2021/0028175 A1 Jan. 28, 2021

Related U.S. Application Data

(62) Division of application No. 16/286,843, filed on Feb. 27, 2019, now Pat. No. 10,804,274.

(51) Int. Cl.
*H01L 23/52* (2006.01)
*H01L 27/105* (2006.01)
(Continued)

(52) U.S. Cl.
CPC ...... *H01L 27/1052* (2013.01); *H01L 21/8229* (2013.01); *H01L 29/0665* (2013.01)

(58) Field of Classification Search
CPC ............ H01L 21/8229; H01L 27/1052; H01L 29/0665
(Continued)

(56) References Cited

U.S. PATENT DOCUMENTS 7,723,789 B2  5/2010 Lin et al.
8,541,274 B1  9/2013 Xie et al.
(Continued)

FOREIGN PATENT DOCUMENTS

WO   2011162725 A1   12/2011

OTHER PUBLICATIONS

Fu et al., "Trap layer engineered gate-all-around vertically stacked twin Si-nanowire nonvolatile memory", International Electron Devices Meeting, 2007, pp. 79-82.
(Continued)

*Primary Examiner* — Luan C Thai
(74) *Attorney, Agent, or Firm* — Cantor Colburn LLP; Kelsey Skodje

(57) ABSTRACT

A method of performing co-integrated fabrication of a non-volatile memory (NVM) and a gate-all-around (GAA) nanosheet field effect transistor (FET) includes recessing fins in a channel region of the NVM and the FET to form source and drain regions adjacent to recessed fins, and removing alternating portions of the recessed fins of the NVM and the FET to form gaps in the recessed fins. A stack of layers that make up an NVM structure are conformally deposited within the gaps of the recessed fins leaving second gaps, smaller than the gaps, and above the recessed fins of the NVM while protecting the FET with the organic planarization layer (OPL) and a block mask. The OPL and block mask are removed from the FET, and another OPL and another block mask protect the NVM while a gate of the FET is formed above the recessed fins and within the gaps.

10 Claims, 15 Drawing Sheets

(51) Int. Cl.
*H01L 21/8229* (2006.01)
*H01L 29/06* (2006.01)

(58) Field of Classification Search
USPC .................................................. 257/773
See application file for complete search history.

(56) References Cited

U.S. PATENT DOCUMENTS

| | | | |
|---|---|---|---|
| 8,779,495 B2 | 7/2014 | Happ et al. |
| 8,890,121 B1 | 11/2014 | Han et al. |
| 8,975,095 B2 | 3/2015 | Han et al. |
| 9,076,686 B1 | 7/2015 | Karda et al. |
| 9,159,829 B1 | 10/2015 | Ramaswamy |
| 9,263,577 B2 | 2/2016 | Ramaswamy et al. |
| 9,276,092 B1 | 3/2016 | Karda et al. |
| 9,276,134 B2 | 3/2016 | Karda et al. |
| 9,305,929 B1 | 4/2016 | Karda et al. |
| 9,337,210 B2 | 5/2016 | Karda et al. |
| 9,356,027 B1 | 5/2016 | Cheng et al. |
| 9,450,024 B2 | 9/2016 | Karda et al. |
| 9,472,560 B2 | 10/2016 | Ramaswamy et al. |
| 9,559,118 B2 | 1/2017 | Karda et al. |
| 9,559,194 B2 | 1/2017 | Karda et al. |
| 9,608,111 B2 | 3/2017 | Ramaswamy |
| 9,659,963 B2 | 5/2017 | Cheng et al. |
| 9,673,203 B2 | 6/2017 | Karda et al. |
| 9,673,390 B2 | 6/2017 | Reed et al. |
| 9,761,715 B2 | 9/2017 | Ramaswamy et al. |
| 9,773,976 B2 | 9/2017 | Karda et al. |
| 9,853,211 B2 | 12/2017 | Sills et al. |
| 9,899,398 B1 | 2/2018 | Colinge et al. |
| 10,615,288 B1 | 4/2020 | Kong et al. |
| 10,749,040 B2 | 8/2020 | Kong et al. |
| 11,201,152 B2 * | 12/2021 | Xie .............. H01L 29/0649 |
| 2008/0237575 A1 | 10/2008 | Jin et al. |
| 2010/0117138 A1 | 5/2010 | Huerta et al. |
| 2011/0058418 A1 | 5/2011 | Choi et al. |
| 2013/0270508 A1 | 10/2013 | Li et al. |
| 2017/0278842 A1 * | 9/2017 | Song .............. H01L 21/823431 |
| 2019/0198629 A1 | 6/2019 | Yeung et al. |
| 2020/0273861 A1 | 8/2020 | Bl et al. |

OTHER PUBLICATIONS

List of IBM Patents or Patent Applications Treated as Related; (Appendix P), Filed Sep. 30, 2020; 2 pages.

* cited by examiner

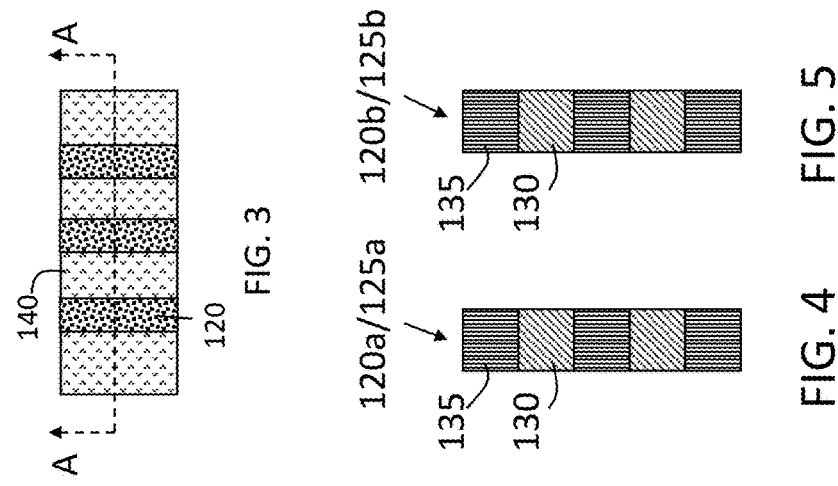
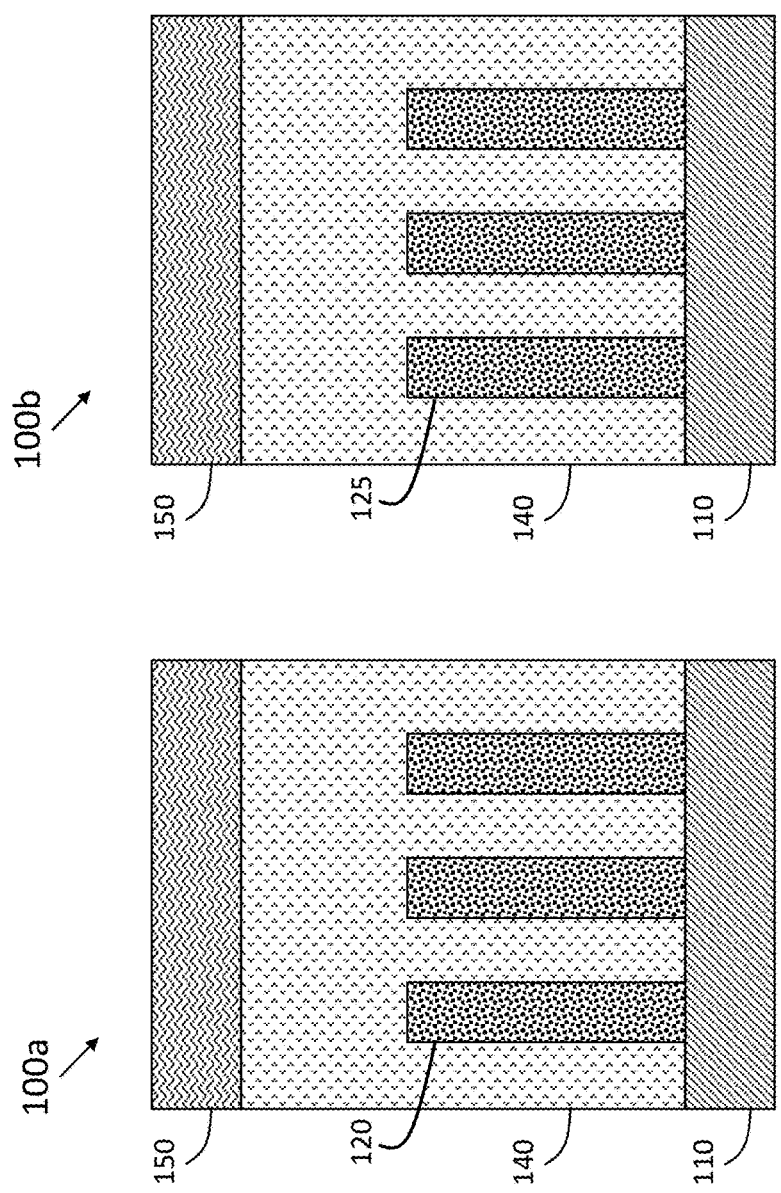

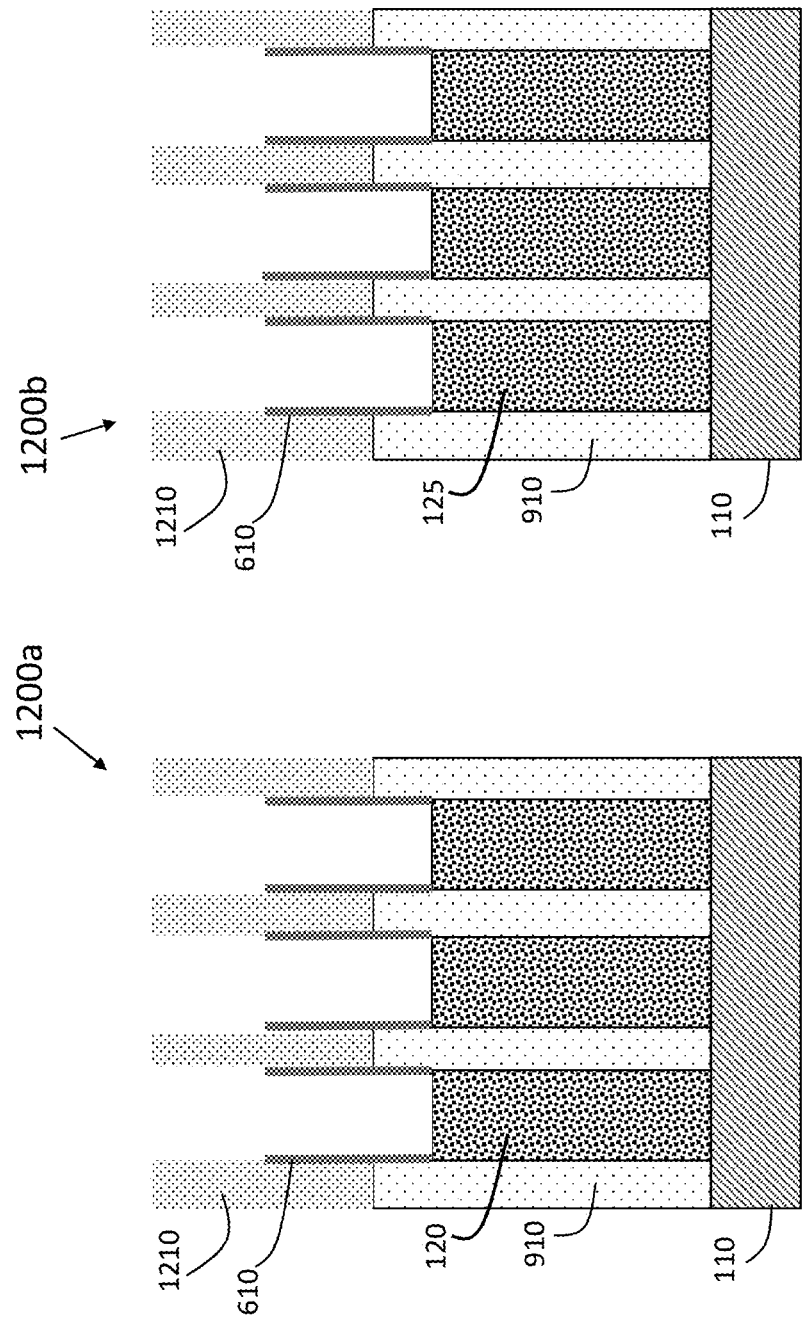

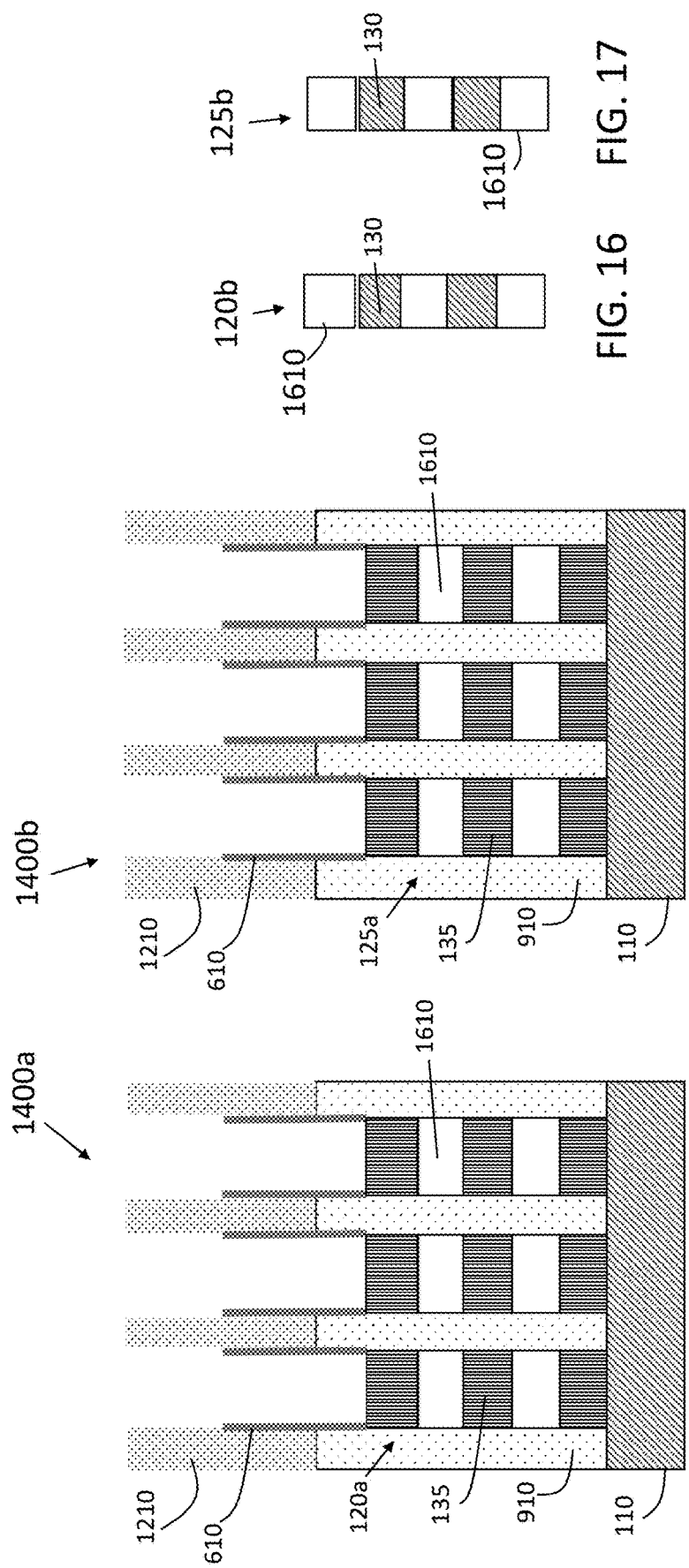

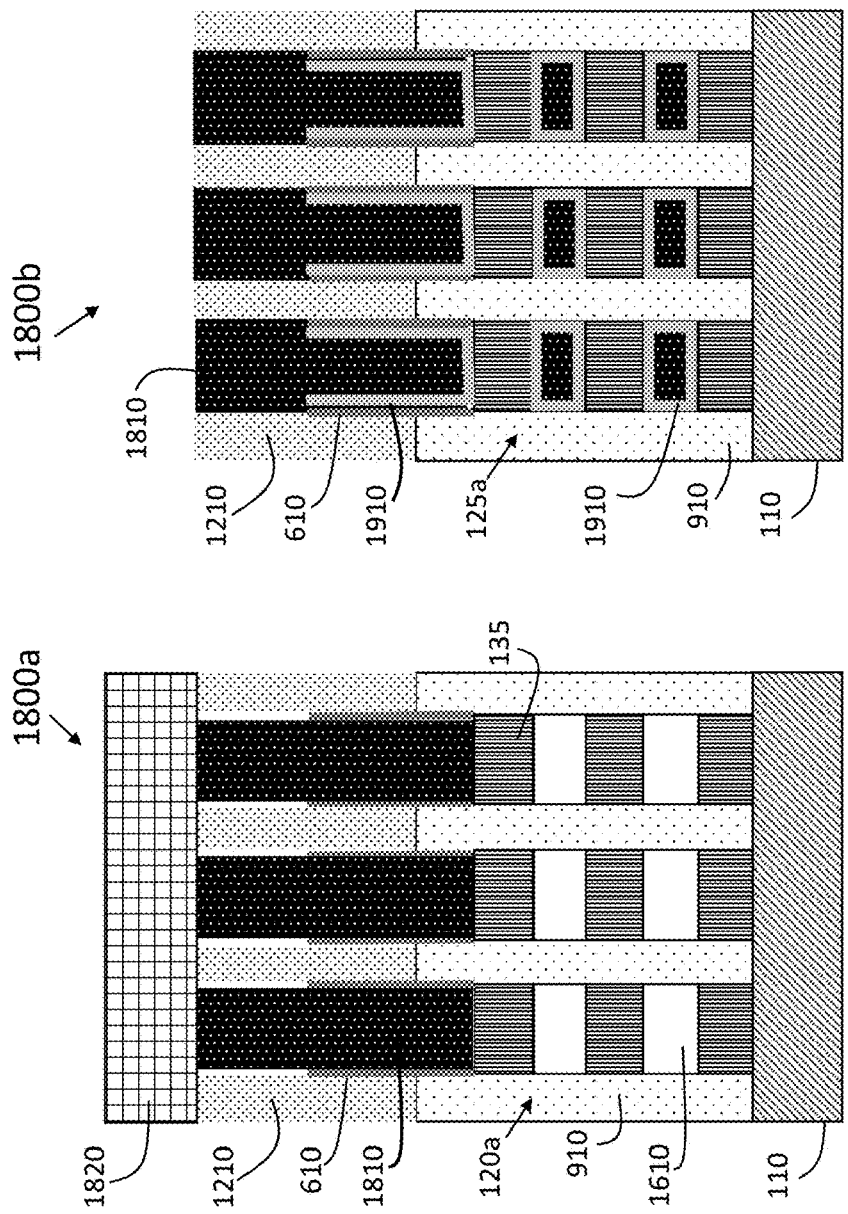

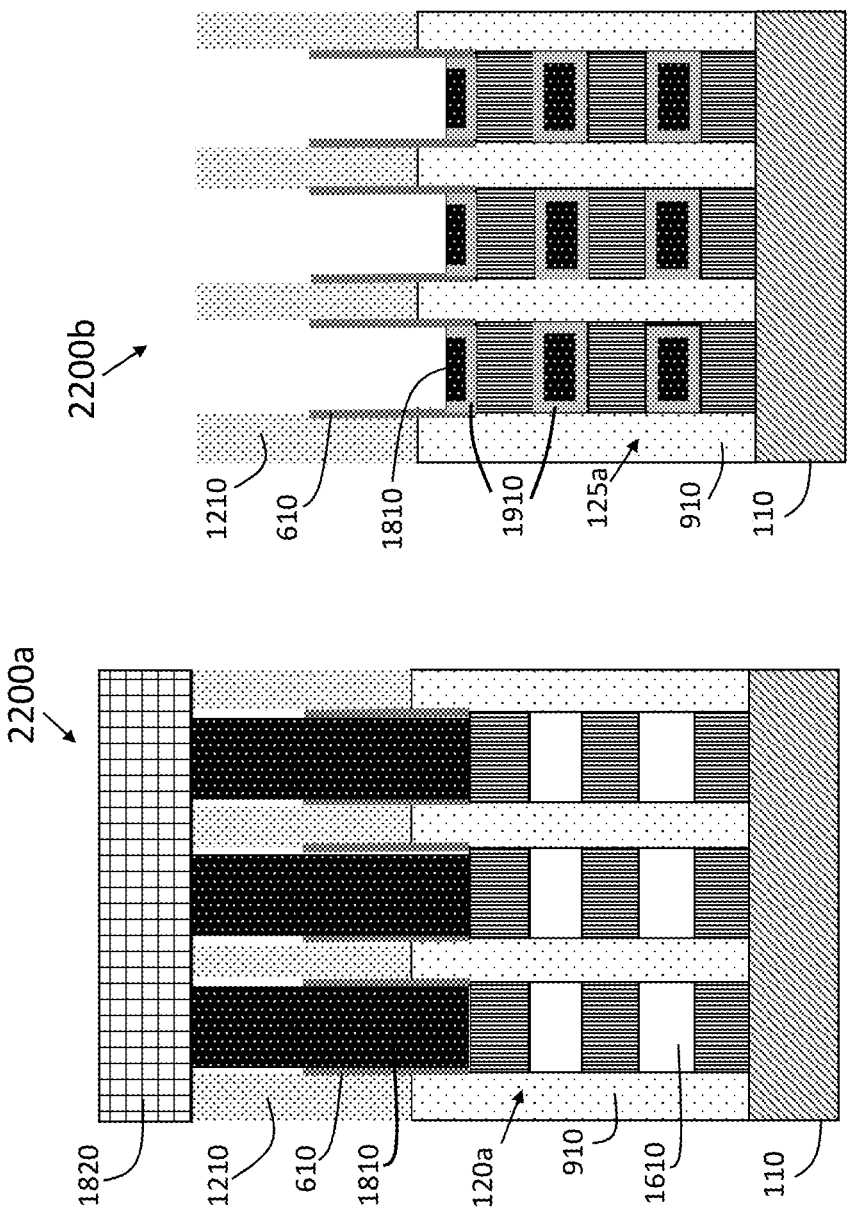

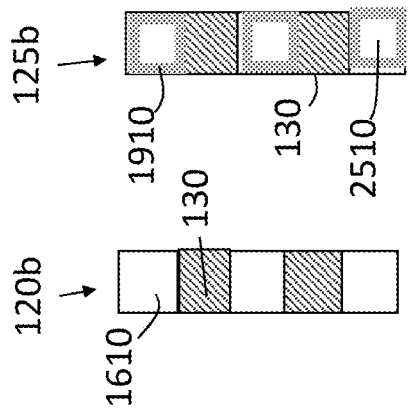
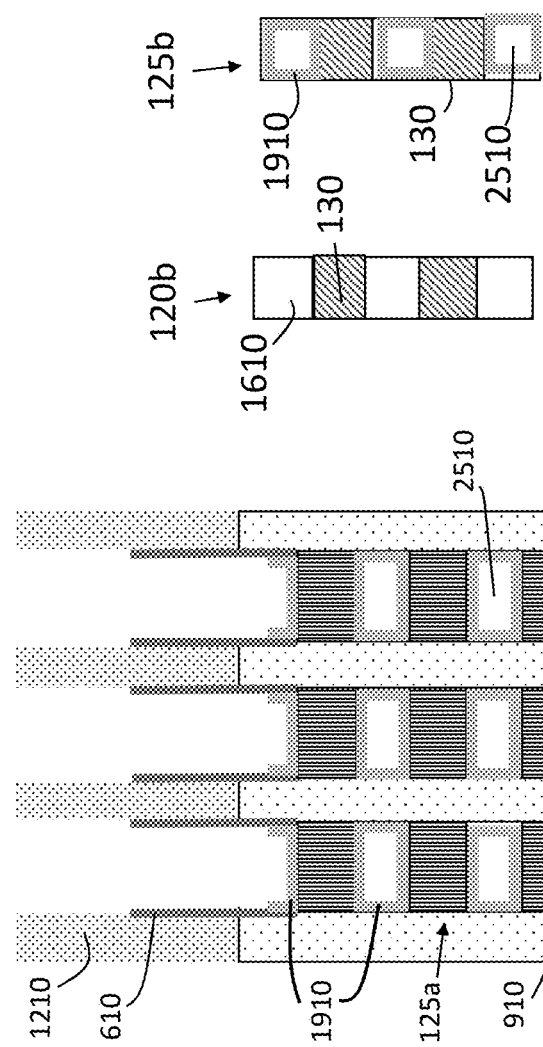
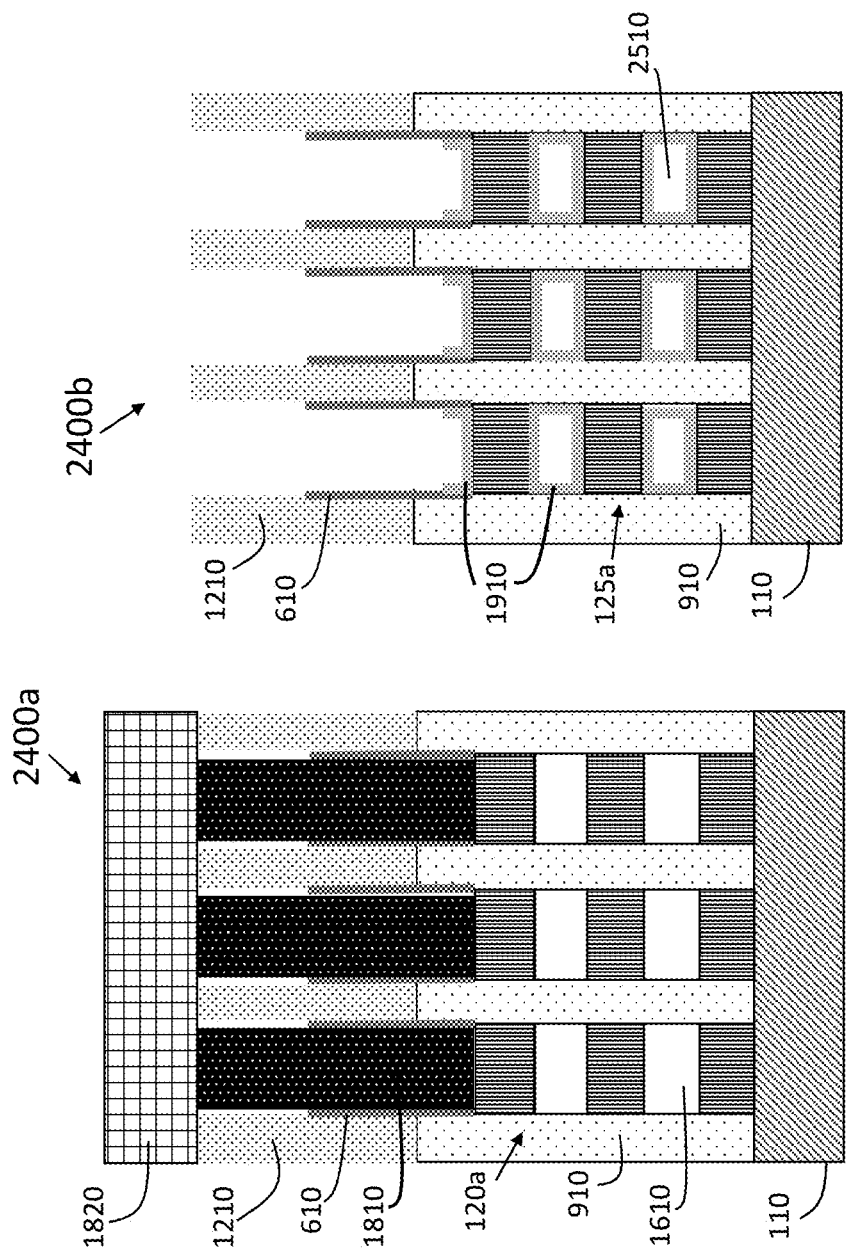
FIG. 24
FIG. 25
FIG. 26
FIG. 27

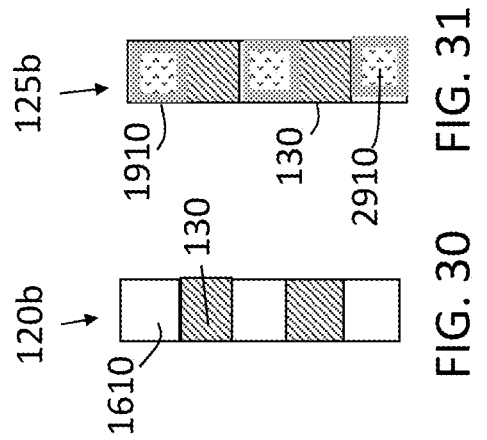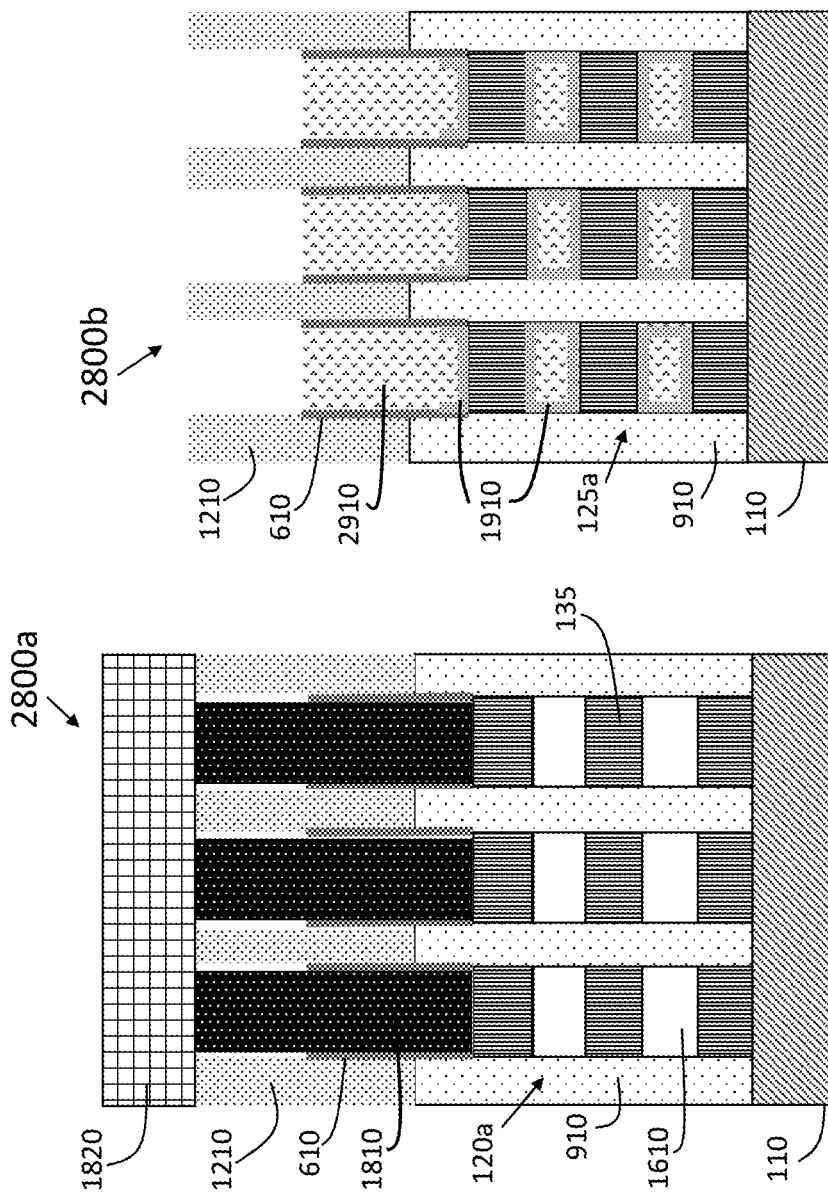

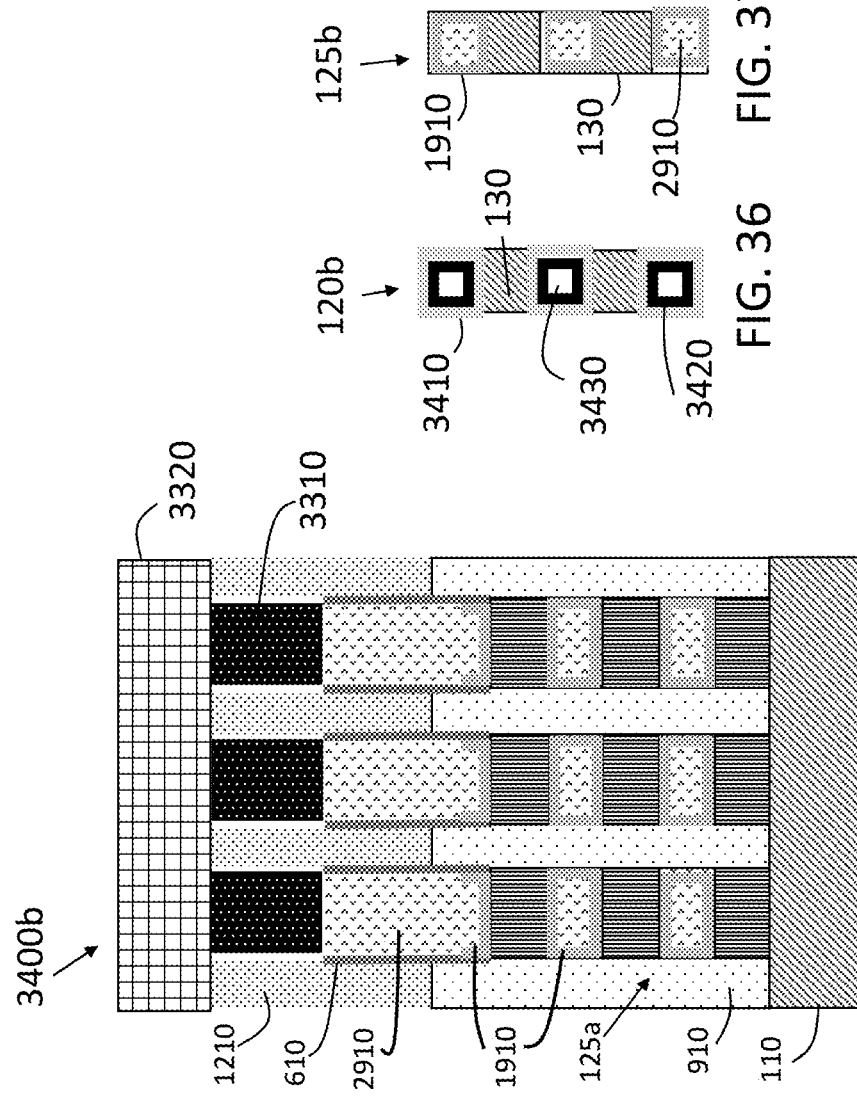
FIG. 35
FIG. 34
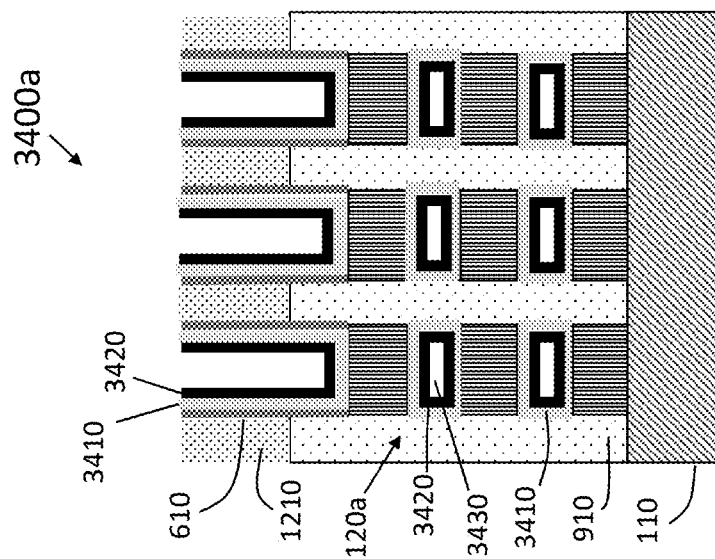
FIG. 36
FIG. 37

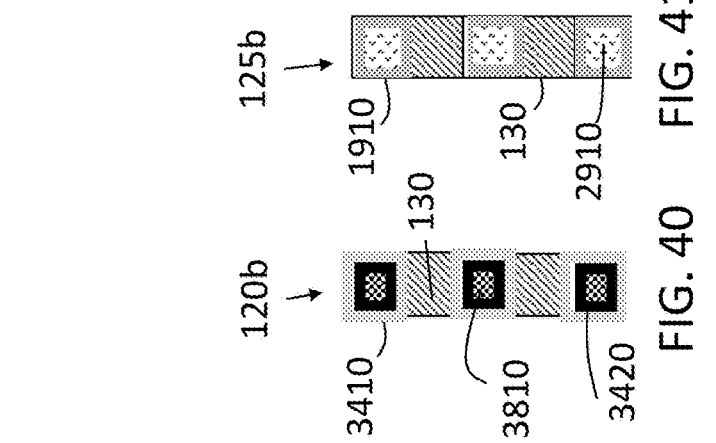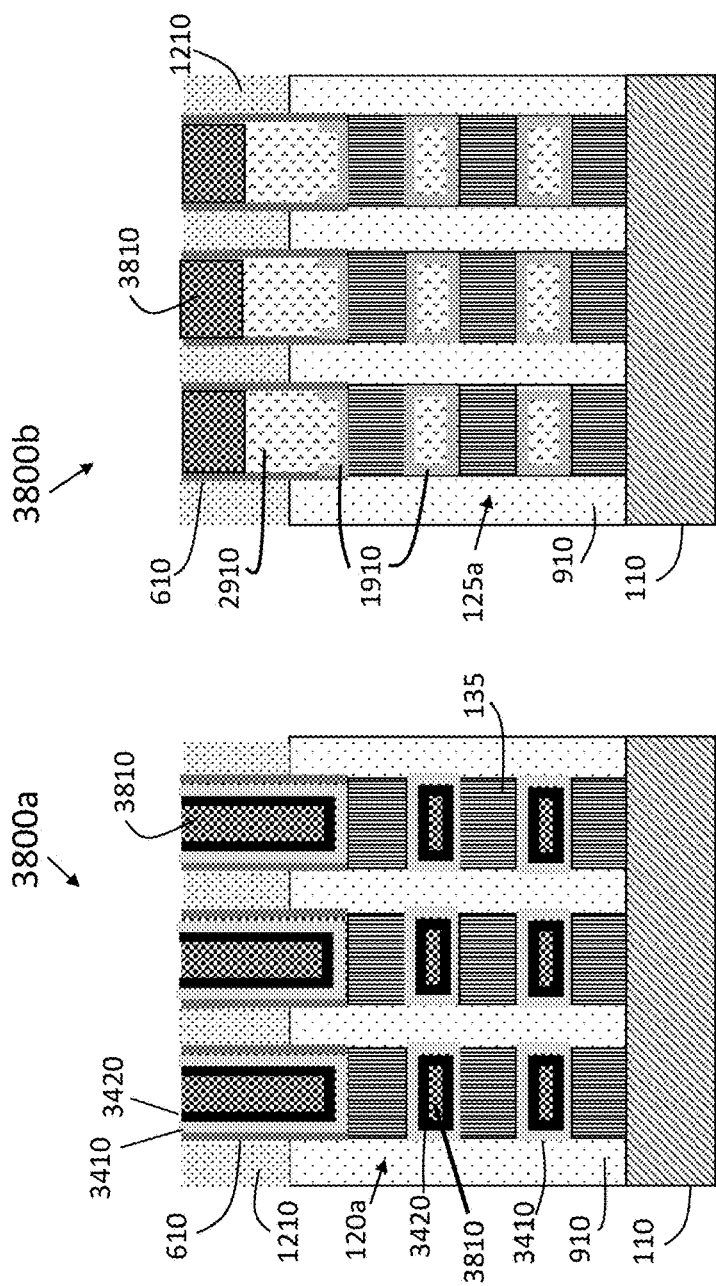

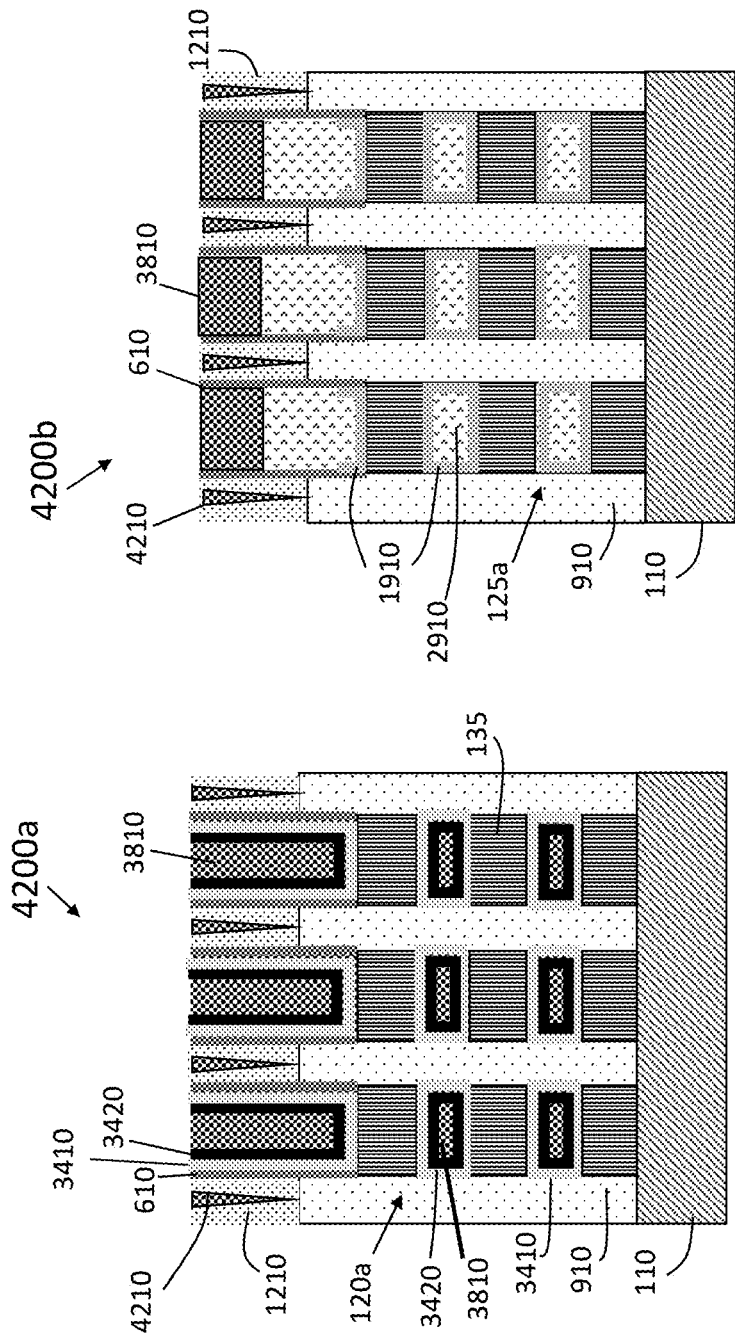

US 11,362,093 B2

1

CO-INTEGRATION OF NON-VOLATILE MEMORY ON GATE-ALL-AROUND FIELD EFFECT TRANSISTOR

DOMESTIC PRIORITY

This application is a division of U.S. patent application Ser. No. 16/286,843 filed Feb. 27, 2019, the disclosure of which is incorporated herein by reference in its entirety.

BACKGROUND

The present invention relates to electronic devices with embedded non-volatile memory (NVM), and more specifically, to co-integration of NVM on a gate-all-around (GAA) field effect transistor (FET).

Electronic devices with embedded NVM are desirable in mobile and automotive applications, because of their high speed, low power consumption, and reliability. In a nanosheet field effect transistor (nanosheet FET), the channel region between the source and drain regions is defined by horizontal silicon sheets, called nanosheets or a nanosheet stack. A fin FET, which has a channel region defined by a fin, is an example of a tri-gate FET, because the gate contacts three surfaces (top and two sides) of the fin-shaped channel. The nanosheet FET is a gate-all-around (GAA) FET, because the gate contacts all four surfaces of each of the nanosheets in the stack that defines the channel region.

SUMMARY

Embodiments of the present invention are directed to integrated devices and methods of performing co-integrated fabrication of a non-volatile memory (NVM) and a gate-all-around (GAA) nanosheet field effect transistor (FET). The method includes recessing fins in a channel region of the NVM and the nanosheet FET to form source and drain regions adjacent to recessed fins, removing alternating portions of the recessed fins of the NVM and the nanosheet FET to form gaps in the recessed fins, and depositing an organic planarization layer (OPL) and a block mask to protect the nanosheet FET. The method also includes conformally depositing a stack of layers that make up an NVM structure within the gaps of the recessed fins to leave second gaps, smaller than the gaps, and above the recessed fins of the NVM while protecting the nanosheet FET with the OPL and the block mask, removing the OPL and the block mask from the nanosheet FET, and depositing another OPL and another block mask to protect the NVM. A gate of the nanosheet FET is formed above the recessed fins and within the gaps while protecting the NVM with the OPL and the block mask.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 1-47 illustrate aspects of the co-integration of non-volatile memory (NVM) on a gate-all-around (GAA) field effect transistor (FET) according to one or more embodiments of the invention, in which:

FIG. 1 shows a cross-sectional view of an intermediate structure that will form the nanosheet FET;

2

Figure 8:
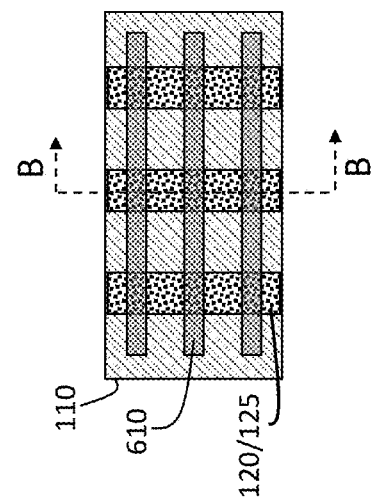
Figure 7:
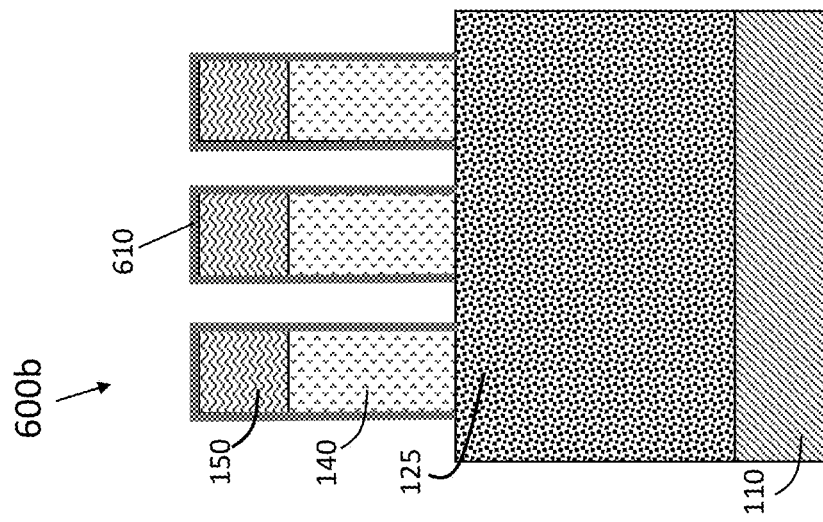
Figure 6:
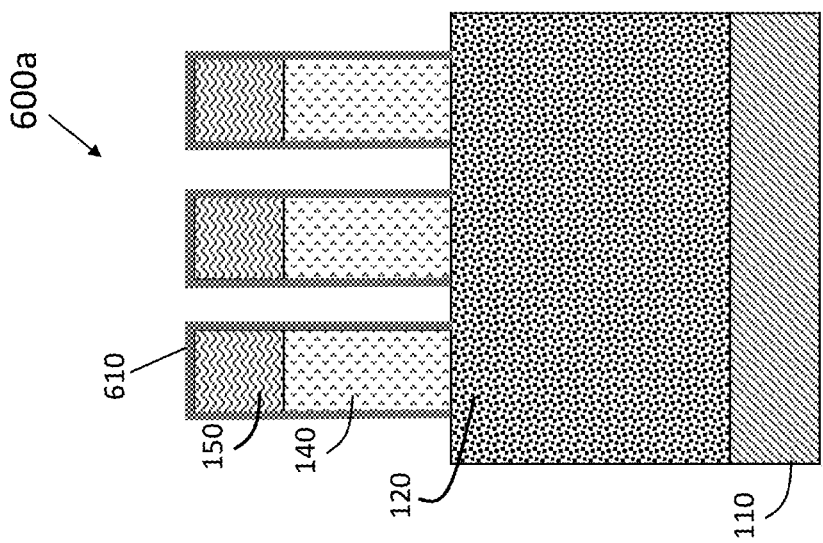
Figure 11:
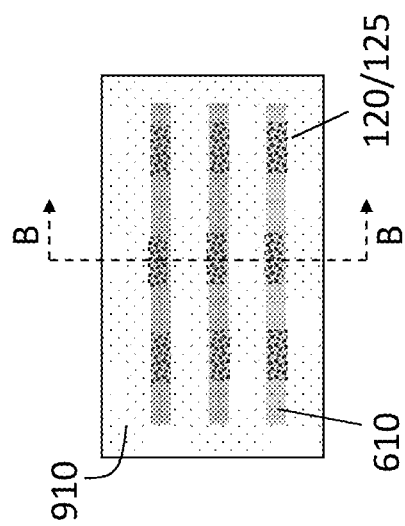
Figure 10:
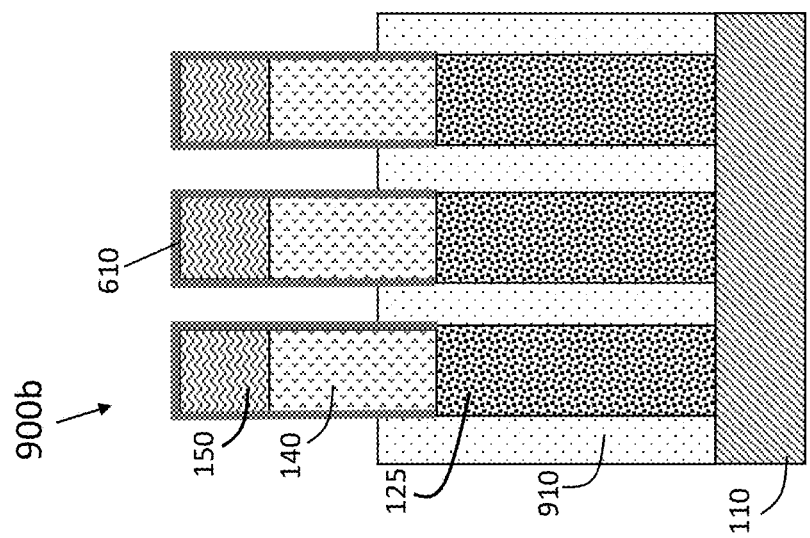
Figure 9:
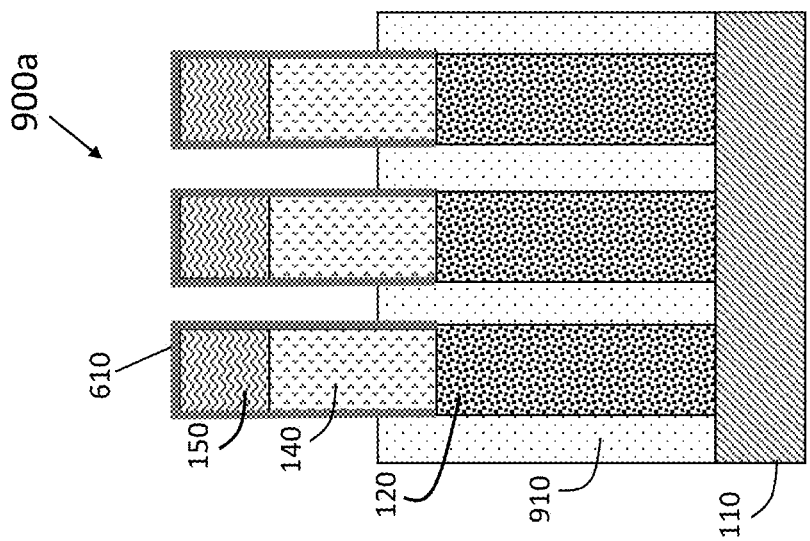
Figure 33:
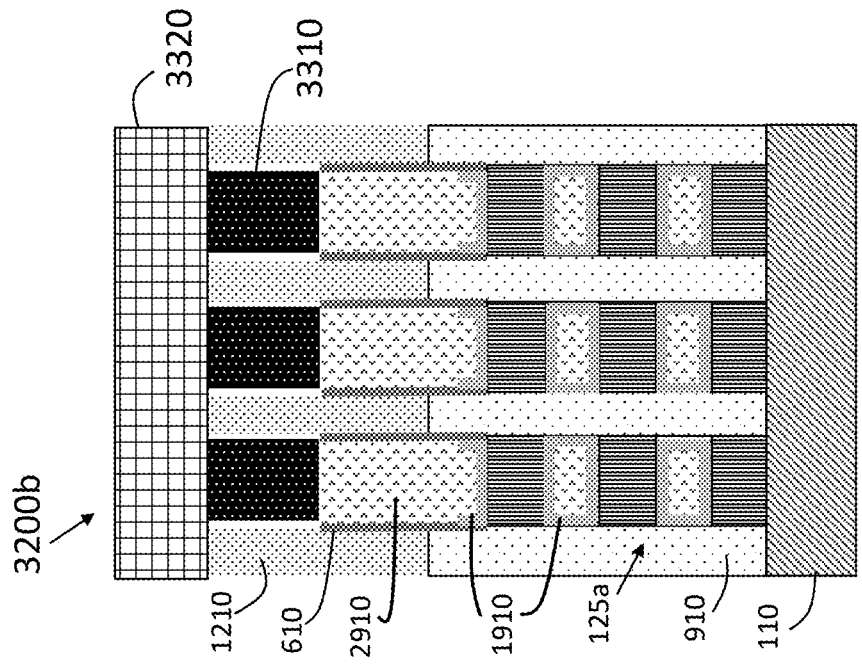
Figure 32:
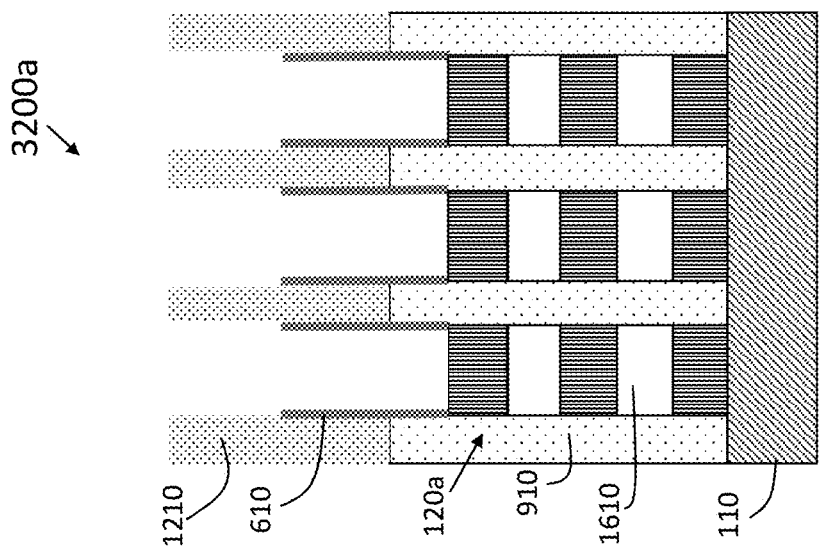
Figures 44, 45:
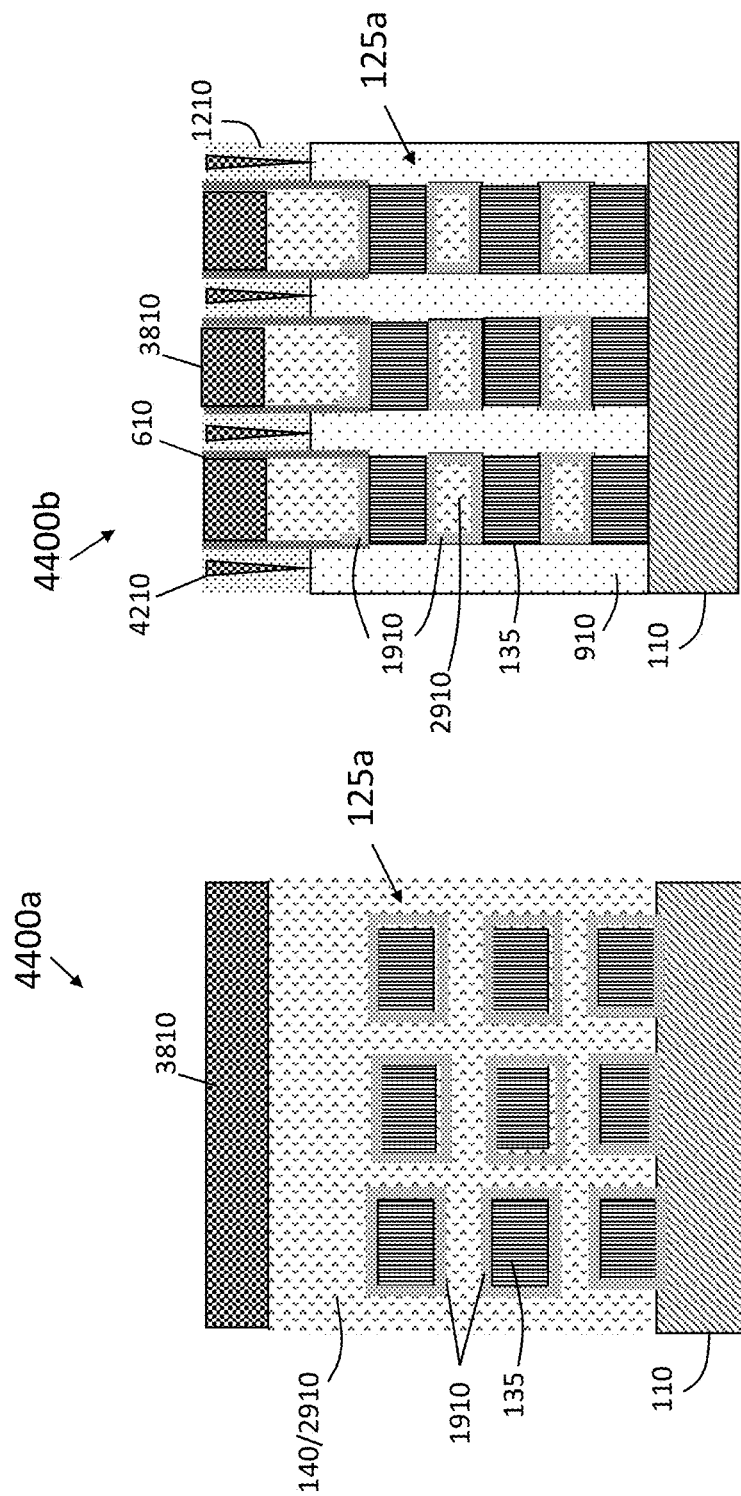
Figure 47:
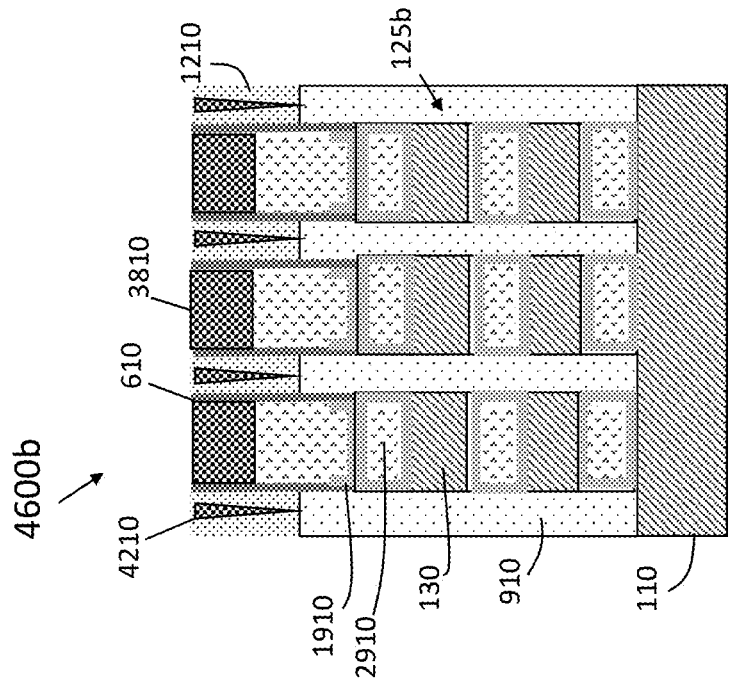
Figure 46:
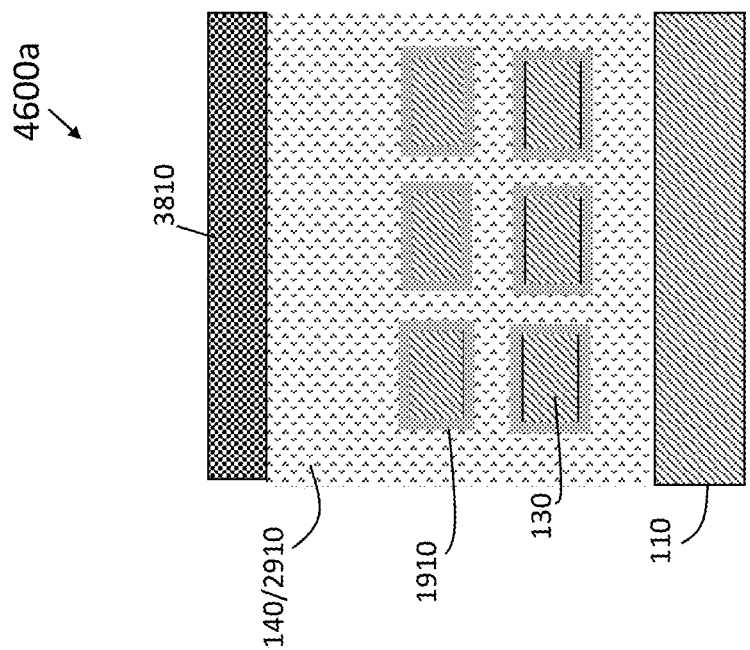

FIG. 2 shows a cross-sectional view of an intermediate structure that will form the NVM;

FIG. 3 shows an overhead view used to indicate a cross-section across fins;

FIG. 4 details the fins of the intermediate structures shown in FIGS. 1 and 2 according to one exemplary embodiment of the invention;

FIG. 5 details the fins of the intermediate structures shown in FIGS. 1 and 2 according to another exemplary embodiment of the invention;

FIG. 6 shows a cross-sectional view of a structure that will form the nanosheet FET following gate patterning;

FIG. 7 shows a cross-sectional view of a structure that will form the NVM following gate patterning;

FIG. 8 shows an overhead view used to indicate a cross-section through a fin;

FIG. 9 shows the result of performing a fin recess on the intermediate structure shown in FIG. 6;

FIG. 10 shows the result of performing a fin recess on the intermediate structure shown in FIG. 7;

FIG. 11 shows an overhead view used to indicate a cross-section through a recessed fin;

FIG. 12 shows the result of performing an oxide fill then removing the gate cap and polysilicon from the intermediate structure shown in FIG. 9;

FIG. 13 shows the result of performing an oxide fill then removing the gate cap and polysilicon from the intermediate structure shown in FIG. 10;

FIG. 14 shows the result of removing silicon from the recessed fins of the intermediate structure shown in FIG. 12;

FIG. 15 shows the result of removing silicon from the recessed fins of the intermediate structure shown in FIG. 13;

FIG. 16 shows the fins resulting from removing silicon germanium from the recessed fins of the intermediate structure shown in FIG. 12;

FIG. 17 shows the fins resulting from removing silicon germanium from the recessed fins of the intermediate structure shown in FIG. 13;

FIG. 18 shows the intermediate structure of FIG. 14 with an organic planarization layer (OPL) and block mask deposited;

FIG. 19 shows the intermediate structure of FIG. 15 with a polysilicon-oxide-nitride-oxide-silicon (SONOS) stack conformally deposited and the OPL deposited;

FIG. 20 shows the fin of the intermediate structure of FIG. 18 according to a different exemplary embodiment;

FIG. 21 shows the fin of the intermediate structure of FIG. 19 according to a different exemplary embodiment;

FIG. 22 shows that the intermediate structure shown in FIG. 18 is unchanged due to the block mask;

FIG. 23 shows the structure of FIG. 19 with the OPL and SONOS stack recessed between the gate spacers;

FIG. 24 shows that the intermediate structure shown in FIG. 18 is unchanged due to the block mask;

FIG. 25 shows the intermediate structure of FIG. 23 with the OPL removed;

FIG. 26 shows the fin of the structure shown in FIG. 24 according to an alternate embodiment of the invention;

FIG. 27 shows the fin of the structure shown in FIG. 25 according to an alternate embodiment of the invention;

FIG. 28 shows that the intermediate structure shown in FIG. 24 is unchanged due to the block mask;

FIG. 29 shows the intermediate structure shown in FIG. 25 with polysilicon deposited in the fin region and between the gate spacers;

FIG. 30 shows the fin of the structure shown in FIG. 28 according to an alternate embodiment of the invention;

FIG. 31 shows the fin of the structure shown in FIG. 29 according to an alternate embodiment of the invention;

FIG. 32 shows the intermediate structure of FIG. 28 with the block mask and OPL removed;

FIG. 33 shows the intermediate structure of FIG. 29 with an OPL and block mask deposited above the polysilicon;

FIG. 34 shows the result of a conformal deposition of a high-k dielectric and a work function metal (WFM) to the structure shown in FIG. 32;

FIG. 35 shows that the block mask prevents a change in the intermediate structure shown in FIG. 33;

FIG. 36 shows the fin of the structure shown in FIG. 34 according to an exemplary embodiment of the invention;

FIG. 37 shows the fin of the structure shown in FIG. 35 according to another exemplary embodiment of the invention;

FIG. 38 shows the result of adding a gate metal within the conformal WFM to the intermediate structure shown in FIG. 34;

FIG. 39 shows the result of adding a gate metal on the intermediate structure shown in FIG. 35;

FIG. 40 shows the fin of the structure shown in FIG. 38 according to an exemplary embodiment of the invention;

FIG. 41 shows the fin of the structure shown in FIG. 39 according to another exemplary embodiment of the invention;

FIG. 42 shows the result of adding metal contacts to the intermediate structure shown in FIG. 38;

FIG. 43 shows the result of adding metal contacts to the intermediate structure shown in FIG. 39;

FIG. 44 shows a cross-sectional view of an intermediate structure that is used in the formation of the NVM according to one exemplary embodiment;

FIG. 45 shows a different cross-sectional view of the intermediate structure that is used in the formation of the NVM according to the one exemplary embodiment;

FIG. 46 shows a cross-sectional view of an intermediate structure that is used in the formation of the NVM according to another exemplary embodiment; and FIG. 47 shows a different cross-sectional view of the intermediate structure that is used in the formation of the NVM according to the other exemplary embodiment.

DETAILED DESCRIPTION

It is understood in advance that although this invention includes a detailed description of exemplary gate-all-around (GAA) nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by incorporating n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling CMOS technology down to seven (7) nanometer node and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. Some of these challenges apply, as well, to other types of FETs (e.g., fin FETs, nanowire FETs). For example, as previously noted, it can be desirable to embed NVM in electronic devices. Currently, NVM technologies are combined in a back end of line (BEOL) process. That is, after the nanosheet FET is formed, additional layers are added to form the NVM. This can lead to performance degradation due to thermal budget limitation, high power consumption, and oxidization.

Turning now to an overview of aspects of the invention, embodiments of the invention address the above-noted shortcomings of the prior art by implementing co-integration of NVM on a GAA structure. A front end of line (FEOL) process is used to form the NVM such that the nanosheet FET and NVM are processed together. Specifically, processing of a depleted polysilicon-oxide-nitride-oxide-silicon (SONOS)-type NVM is integrated on the same wafer as a nanosheet FET device. The SONOS-type flash memory exhibits improved data retention over other technologies like floating gate devices. Two different exemplary embodiments of the invention are specifically discussed, one that involves an NVM with a SiGe channel and one that involves an NVM with a Si channel.

FIGS. 1-47 illustrate aspects of the co-integration of NVM on a gate-all-around (GAA) field effect transistor (FET) according to one or more embodiments of the invention. FIG. 1 shows a cross-sectional view of an intermediate structure 100a in the formation of a nanosheet FET. FIG. 2 shows a cross-sectional view of an intermediate structure 100b in the formation of an NVM according to two or more exemplary embodiments of the invention. The intermediate structures 100a and 100b are formed at the same time according to the integration scheme implemented according to embodiments of the invention. The intermediate structures 100a and 100b are the same at this stage. Fins 120 and 125 are formed on a substrate 110. A hardmask 150 is deposited on a dummy gate fill of polysilicon 140. In previous steps, the polysilicon 140 is deposited and planarized, by a chemical mechanical planarization (CMP), for example. The hardmask 150 may be silicon nitride (SiN), for example.

FIG. 3 is an overhead view at the level of the fins 120 and 125 that is used to indicate the cross-section A-A shown in FIGS. 1 and 2. FIGS. 4 and 5 detail two different embodiments for the fins 120 and 125 during the intermediate stage shown in FIGS. 1 and 2. FIG. 4 shows the composition of the fins 120a and 125a according to an exemplary embodiment of the invention. According to the exemplary embodiment of the invention shown in FIG. 4, the fins 120a and 125a are alternating layers of Si 130 and silicon germanium (SiGe) 135. FIG. 5 shows the composition of the fins 120b and 125b according to another exemplary embodiment of the invention. According to the exemplary embodiment of the invention shown in FIG. 5, the fins 120b and 125b are also comprised of alternating layers of Si 130 and SiGe 135 at this stage in the fabrication.

The substrate 110 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also comprise an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the substrate 410 can also comprise a hybrid oriented (HOT) semiconductor substrate in which the HOT substrate has surface regions of different crystallographic orientation. The substrate 110 can be doped, undoped, or contain doped regions and undoped regions therein. The substrate 110 can contain regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as shallow trench isolation (STI), fins, nanowires, nanosheets, resistors, capacitors, etc.

FIGS. 6 and 7 show intermediate structures 600a and 600b resulting from processing, respectively, of intermediate structures 100a and 100b. FIG. 6 shows the intermediate structure 600a in the formation of the nanosheet FET, and FIG. 7 shows the intermediate structure 600b in the formation of the NVM. The polysilicon 140 is patterned using a reactive ion etch (ME) process, for example. A spacer 610 is then deposited and patterned. The spacer 610 may be formed by a RIE process, as well. The view of the intermediate structures 600a and 600b shown in FIGS. 6 and 7 are indicated in FIG. 8. FIG. 8 is an overhead view of the intermediate structures 600a and 600b, which are the same. As FIG. 8 shows, the cross-section B-B through one of the fins 120 or 125 is shown by FIGS. 6 and 7. It bears noting that the fins 120 and 125 in FIGS. 6-8 may either be as the fins 120a and 125a shown in FIG. 4 or the fins 120b and 125b shown in FIG. 5, which are the same at this stage in the fabrication.

FIGS. 9 and 10 show intermediate structures 900a and 900b that result from processing intermediate structures 600a and 600b, respectively. FIG. 9 shows the intermediate structure 900a in the formation of the nanosheet FET, and FIG. 10 shows the intermediate structure 900b in the formation of the NVM. The fin 120 or 125 is recessed in both intermediate structures 900a and 900b, and the result of epitaxial growth of a source/drain region 910 is shown. FIG. 11 is an overhead view showing that the cross-section B-B is shown in FIGS. 9 and 10. The recessed fins 120 or 125 below the patterned polysilicon 140 are indicated in FIG. 11 for reference. Like the previously shown intermediates structure pairs 100a and 100b and 600a and 600b, the intermediate structures 900a and 900b are the same. In addition, the fins 120 and 125 may either be fins 120a and 125a shown in FIG. 4 or fins 120b and 125b shown in FIG. 5, all of which are comprised of alternating layers of Si 130 and SiGe 135 at this stage.

FIGS. 12 and 13 respectively show intermediate structures 1200a and 1200b that result from processing of intermediate structures 900a and 900b, shown in FIGS. 9 and 10. The cross-section B-B is shown in FIGS. 12 and 13 as in FIGS. 9 and 10. A fill with a flowable oxide (FOX) 1210 is followed by a CMP landing on the hardmask 150. That is the spacer 610 on the hardmask 150 is removed. The FOX 1210 can be silicon dioxide ($SiO_2$). Then, a replacement metal gate (RMG) cap (i.e., hardmask 150) removal and polysilicon 140 pull result in the intermediate structures 1200a and 1200b. The intermediate structures 1200a and 1200b are the same. Thus, up to this point, the nanosheet FET and the NVM are processed the same way. As previously noted, the fins 120 and 125 are the same up to this point and may be alternating Si 130 and SiGe 135.

FIGS. 14 and 15 show intermediate structures 1400a and 1400b that result from processing of the fins 120 and 125. FIG. 14 shows an exemplary embodiment of the intermediate structure 1400a that ultimately results in the nanosheet FET after removal of portions of the fin 120a, leaving gaps 1610. FIG. 15 shows an exemplary embodiment of the intermediate structure 1400b that ultimately results in the NVM after removal of portions of the fin 125a, leaving gaps 1610. The view shown for both intermediate structures 1400a and 1400b is cross-section B-B. In the exemplary embodiment shown in FIGS. 14 and 15, the portion of the fins 120a and 125a that is removed is the Si 130, leaving SiGe 135 in alternating layers with the gaps 1610. FIG. 16 shows the fins 120b according to a different exemplary embodiment than the one shown in FIG. 14. FIG. 17 shows the fins 125b according to a different exemplary embodiment than the one shown in FIG. 15. Both fins 120b, 125b indicate the removal of SiGe 135 leaving alternating layers of Si 130 and gaps 1610.

FIGS. 18 and 19 are cross-sectional views along cross-section B-B. FIG. 18 shows an intermediate structure 1800a used to fabricate the nanosheet FET and FIG. 19 shows an intermediate structure 1800b used to fabricate the NVM. The intermediate structure 1800a results from the deposition of an organic planarization layer (OPL) 1810 between the spacers 610 of the intermediate structure 1400a followed by the formation of a block mask 1820. The gaps 1610 in the fins 120a are maintained. The intermediate structure 1800b results from the formation of a stack 1910 of materials conformally between the spacers 610 and also in the gaps 1610 formed in the fins 125a. The stack 1910 includes, from first to last-deposited, $SiO_2$, hafnium dioxide ($HfO_2$), and silicon oxide nitride (SiON), referred to together as SONOS, and defines the NVM structure. The thicknesses of the layers of the stack 1910 may be on the order of 1 nanometer (nm) $SiO_2$, 2 nm $HFO_2$, and 1 nm SiON. The OPL 1810 is used as a fill, as shown. In alternate embodiments of the invention, a flowable nitride fill can be used instead. A CMP process levels the OPL 1810 with the FOX 1210.

FIGS. 20 and 21 show the fins 120b and 125b respectively associated with the intermediate structures 1800a and 1800b according to a different embodiment of the invention than the one shown in FIGS. 18 and 19. FIG. 20 shows that the fin 120b is unchanged and has alternating layers of Si 130 and the gaps 1610. FIG. 21 shows that the conformal stack 1910 and OPL 1810 fill in the gaps between Si 130 layers in fins 125b.

FIG. 22 shows that the intermediate structure 2200a is unchanged from the intermediate structure 1800a. This is because the block mask 1820 protects the intermediate structure 1800a during further processing of the intermediate structure 1800b to result in the intermediate structure 2200b. Although not shown again, fins 120b, like fins 120a, are unchanged based on the processing to the NVM intermediate structure. FIG. 23 shows the result of a recess of the OPL 1810 or a flowable nitride fill, according to alternate embodiments. The recess may be a wet etch process, for example, and is followed by removal of the stack 1910 from sidewalls of the spacer 610. The fins 125a are unchanged from those in the intermediate structures 1800a and 1800b, respectively. Although not shown again, fins 125b are also unchanged from those shown in FIG. 21.

FIG. 24 shows the same intermediate structure 2400a as the intermediate structures 1800a and 2200a. FIG. 25 shows further processing of the intermediate structure 2200b to result in the intermediate structure 2400b. Specifically, the remaining OPL 1810 or flowable nitride fill is removed. This results in a gap 2510 that is smaller than the gap 1610. The conformally deposited stack 1910 is retained in the fins 125a, as shown. FIGS. 26 and 27 show the fins 120b and 125b according to a different embodiment than the one shown in FIGS. 24 and 25. Like fins 120a, fins 120b are unchanged, as shown in FIG. 26. As shown in FIG. 27, the OPL 1810 is removed leaving the stack 1910 and gap 2510 in alternating layers with Si 130 in fins 125b.

FIG. 28 shows the same intermediate structure 2800a as the intermediate structures 1800a, 2200a, and 2400a. FIG. 29 shows further processing of the intermediate structure 2400b to result in the intermediate structure 2800b. Specifically, a polysilicon 2910 is deposited between the spacers 610 and within the SONOS stack 1910 that is conformally formed in the fins 125a. FIG. 30 shows that, like fins 120a, fins 120b are unchanged at this processing stage. FIG. 31 shows that polysilicon 2910 is deposited within the SONOS stack 1910 that is conformally formed in the fins 125b according to an alternate embodiments. Both fins 120b and 25b still have alternating layers of Si 130.

FIG. 32 shows the intermediate structure 3200a that is used to form the nanosheet FET. The block mask 1820 and the OPL 1810 below the block mask 1820 are removed from the intermediate structure 2800a to form the intermediate structure 3200a. FIG. 33 shows the intermediate structure 3200b that is used to form the NVM. An OPL 3310 is deposited above the polysilicon 2910 that is between the spacers 610, and a block mask 3320 is formed above. This block mask 3320 protects the intermediate structure 3200b during further processing of the nanosheet FET side (i.e., intermediate structure 3200a). The fins 120a and 125a are shown in FIGS. 32 and 33, respectively. The same processing that results in the structures shown in FIGS. 32 and 33 can also be performed with the fins 120b and 125b shown in FIGS. 30 and 31, according to an alternate embodiment of the invention.

FIG. 34 shows the intermediate structure 3400a that results from conformal deposition of a high-k dielectric 3410 followed by conformal deposition of a workfunction metal (WFM) 3420 between the spacers 610 and also within the gap 1610. This results in a smaller gap 3430 than gap 1610 remaining in the fins 120a. FIG. 35 shows that the intermediate structure 3400b that results from further processing of intermediate structures 3200a and 3200b has no effect on intermediate structure 3200b. That is, the intermediate structure 3400b that is used to form the NVM is unchanged from the intermediate structure 3200b. FIGS. 36 and 37 respectively show the fins 120b and 125b of the intermediate structures 3400a and 3400b according to an alternate embodiment of the invention. As shown in FIG. 36, the fins 120b include Si 130 layers alternating with the box comprising the high-k dielectric 3410 and the WFM 3420 with the gap 3430 within. FIG. 37 shows that the fins 125b are unchanged based on the processing to obtain the intermediate structure 3400a with the fins 120b shown in FIG. 36.

FIG. 38 shows the intermediate structure 3800a that results from a gate metal 3810 fill followed by a CMP process. The gate metal 3810 can be tungsten (W), for example. The gate metal 3810 is deposited not only in the conformal layer of the WFM 3420 but also fills the gap 3430 in the fins 120a. FIG. 39 shows the intermediate structure 3800b that results from removal of the block mask 3320 and OPL 3310, recessing of the polysilicon 2910 between the spacers 610, and deposition of the gate metal 3810, as shown. The gate metal 3810 acts as a contact to the polysilicon 2910 below. FIGS. 40 and 41 respectively show the fins 120b and 125b of the intermediate structures 3800a and 3800b according to an alternate embodiment of the invention. As FIG. 40 shows, the gap 3430 is filled with the gate metal 3810. This is alternated with Si 130 in the embodiment shown in FIG. 40. FIG. 41 shows that the fin 125b is not altered from the previous stage, as shown in FIG. 37.

FIG. 42 shows a cross-sectional view (cross-section B-B) of an intermediate structure 4200a that forms the nanosheet FET. Contacts 4210 to the source/drain region are patterned in the FOX 1210 and filled with metal such as the gate metal 3810 (e.g., W). FIG. 43 shows a cross-sectional view (cross-section B-B) of an intermediate structure 4200b that forms the NVM. Contacts 4210 are formed in the FOX 1210 as in the intermediate structure 4200a. While the exemplary embodiment with fins 120a and 125a is shown, the same structures can have fins 120b and 125b, respectively shown in FIGS. 40 and 41, according to an alternate embodiment of the invention.

FIG. 44 shows a cross-sectional view (cross-section A-A) of an intermediate structure 4400a used to form the NVM according to one exemplary embodiment of the invention. FIG. 45 shows a cross-sectional view (cross-section B-B) of the same intermediate structure 4400b shown in FIG. 44, which is used to form the NVM according to one exemplary embodiment of the invention. According to the exemplary embodiment shown in FIGS. 44 and 45, SiGe 135 is retained after Si 130 is removed from the fins 125a, because the fins 125a were initially formed as alternating layers of Si 130 and SiGe 135.

FIG. 46 shows a cross-sectional view (cross-section A-A) of an intermediate structure 4600a used to form the NVM according to another exemplary embodiment of the invention. FIG. 47 shows a cross-sectional view (cross-section B-B) of the same intermediate structure 4600b shown in FIG. 46, which is used to form the NVM according to another exemplary embodiment of the invention. According to the exemplary embodiment shown in FIGS. 44 and 45, Si 130 is retained after SiGe 135 is removed from the fins 125b, because the fins 125b were initially formed as alternating layers of Si 130 and SiGe 135.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal,"

"top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated device including a non-volatile memory (NVM) and a nanosheet field effect transistor (FET), the device comprising:
    fins of a channel region of the NVM formed on a substrate;

fins of a channel region of the nanosheet FET formed on the substrate;

a stack of layers that make up an NVM structure conformally formed in alternating portions of the fins of the NVM;

gate material formed in alternating portions of the fins of the nanosheet FET;

source and drain regions between the fins of the NVM and the fins of the nanosheet FET; and a gate formed above the fins of the nanosheet FET.

2. The device according to claim 1, wherein the stack of layers that make up the NVM structure includes silicon oxide nitride.

3. The device according to claim 2, wherein the stack of layers that make up the NVM structure includes hafnium dioxide.

4. The device according to claim 3, wherein the stack of layers that make up the NVM structure includes silicon dioxide.

5. The device according to claim 1, wherein alternating portions of the fins of the NVM and of the nanosheet FET include silicon.

6. The device according to claim 1, wherein alternating portions of the fins of the NVM and of the nanosheet FET include silicon germanium.

7. The device according to claim 1, further comprising a flowable oxide above the source and drain regions of the NVM and the nanosheet FET.

8. The device according to claim 7, further comprising contacts to the source and drain regions of the NVM and the nanosheet FET patterned in the flowable oxide.

9. The device according to claim 1, further comprising polysilicon within the stack of layers in the alternating portions of the fins and above the fins of the NVM.

10. The device according to claim 9, further comprising contacts to the polysilicon of the NVM.

* * * * *